(12) United States Patent
Wada et al.

(10) Patent No.: US 7,417,196 B2
(45) Date of Patent: Aug. 26, 2008

(54) MULTILAYER BOARD WITH BUILT-IN CHIP-TYPE ELECTRONIC COMPONENT AND MANUFACTURING METHOD THEREOF

(75) Inventors: Ryuichiro Wada, Kyoto (JP); Tetsuya Ikeda, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/684,147

(22) Filed: Mar. 9, 2007

(65) Prior Publication Data

US 2007/0158103 A1 Jul. 12, 2007

Related U.S. Application Data

(63) Continuation of application No. PCT/JP2005/009853, filed on May 30, 2005.

(30) Foreign Application Priority Data

Sep. 13, 2004 (JP) ............................. 2004-266107

(51) Int. Cl.
*H05K 1/16* (2006.01)
(52) U.S. Cl. ...................... 174/260; 174/261
(58) Field of Classification Search ............... 174/260, 174/261, 262; 361/760–763, 792–795
See application file for complete search history.

(56) References Cited

U.S. PATENT DOCUMENTS

| 5,876,538 | A | 3/1999 | Steinle et al. |
| 6,038,133 | A * | 3/2000 | Nakatani et al. ............ 361/760 |
| 6,241,838 | B1 | 6/2001 | Sakamoto et al. |
| 6,252,481 | B1 * | 6/2001 | Iwao et al. .................... 336/83 |
| 6,395,118 | B1 | 5/2002 | Sakamoto et al. |
| 6,551,427 | B2 | 4/2003 | Sakamoto et al. |
| 6,876,091 | B2 * | 4/2005 | Takeuchi et al. ............ 257/793 |
| 7,242,591 | B2 * | 7/2007 | Imamura et al. ............ 361/761 |
| 2002/0026978 | A1 | 3/2002 | Harada et al. |

FOREIGN PATENT DOCUMENTS

| GB | 2 197 540 A | 5/1988 |
| JP | 60-182195 A | 9/1985 |
| JP | 63-169798 A | 7/1988 |

(Continued)

OTHER PUBLICATIONS

Official Communication for PCT Application NO. PCT/JP2005/009853; mailed on Sep. 6, 2005.

*Primary Examiner*—Ishwar (I. B.) Patel
(74) *Attorney, Agent, or Firm*—Keating & Bennett, LLP

(57) ABSTRACT

A chip-type electronic component built-in multilayer board includes a multilayer board including two or more layered dielectric layers and an inner conductor pattern, and a chip-type electronic component which is provided at the interface of the upper and lower dielectric layers and includes an external terminal electrode. The external terminal electrode is connected to an in-plane conductor provided at a interface via a first connection conductor extending along the chip-type electronic component in the lower direction from the interface of the upper and lower dielectric layers, and a second connection conductor extending along the chip-type electronic component in the upper direction from the interface of the upper and lower dielectric layers.

11 Claims, 11 Drawing Sheets

FOREIGN PATENT DOCUMENTS

| | | |
|---|---|---|
| JP | 3-109794 A | 5/1991 |
| JP | 5-21930 A | 1/1993 |
| JP | 06-32378 B2 | 4/1994 |
| JP | 6-151635 A | 5/1994 |
| JP | 9-92977 A | 4/1997 |
| JP | 09-246727 A | 9/1997 |
| JP | 11-163530 A | 6/1999 |
| JP | 2001-60767 A | 3/2001 |
| JP | 2002-84067 A | 3/2002 |
| JP | 2003-332741 A | 11/2003 |

* cited by examiner

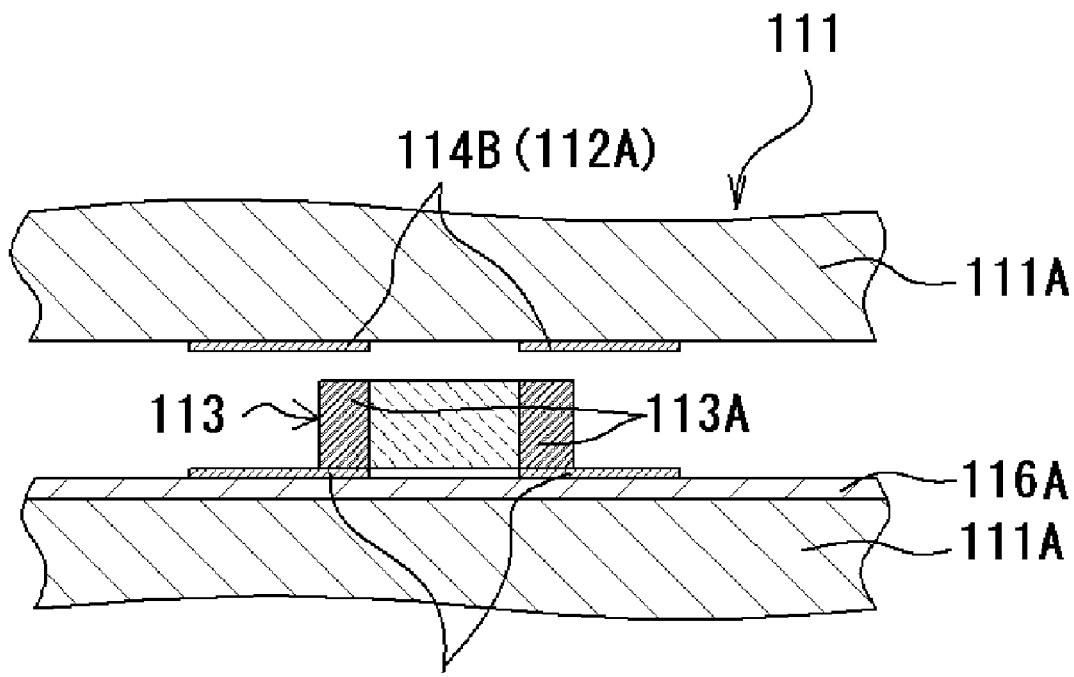
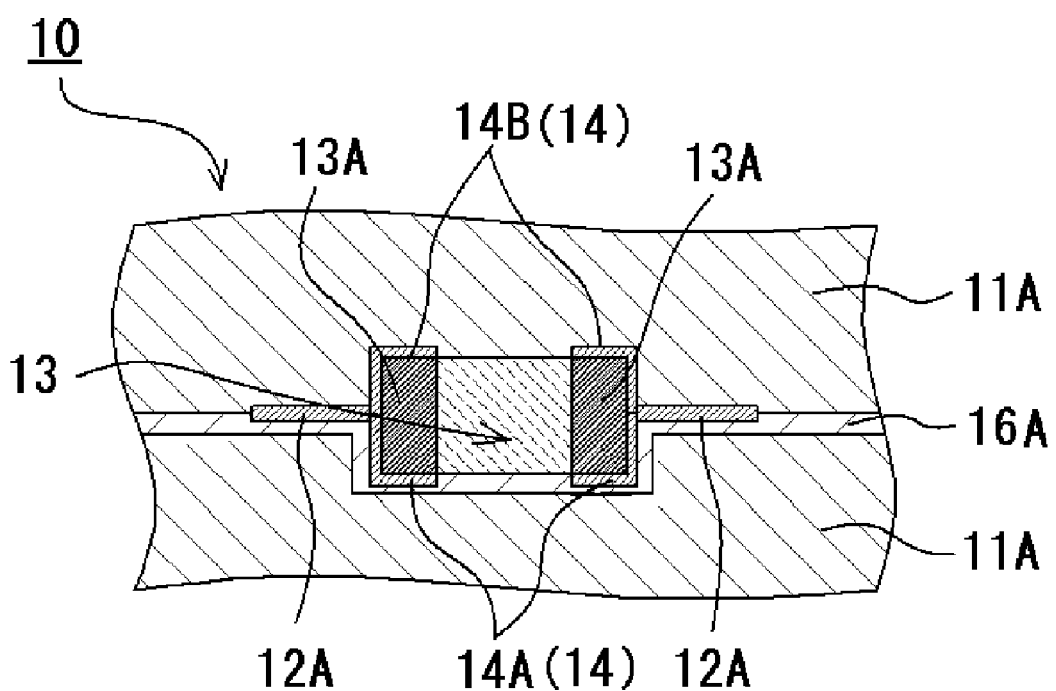

MULTILAYER BOARD WITH BUILT-IN CHIP-TYPE ELECTRONIC COMPONENT AND MANUFACTURING METHOD THEREOF

BACKGROUND OF THE INVENTION

1. Field of the Invention

The present invention relates to a multilayer board including a built-in chip-type electronic component and a manufacturing method thereof, and more particularly, to a multilayer board including a built-in chip-type electronic component and a manufacturing method thereof, whereby the reliability of the connection configuration between a wiring conductor in a multilayer board and a chip-type electronic component built in the multilayer board are improved.

2. Description of the Related Art

A multilayer ceramic board including a built-in electronic component is disclosed in Japanese Examined Patent Application Publication No. 06-32378 (Patent Document 1), and another multilayer ceramic board and a manufacturing method thereof is disclosed in Japanese Unexamined Patent Application Publication No. 2002-84067 (Patent Document 2).

The multilayer ceramic board including a built-in electronic component disclosed in Patent Document 1 includes a multilayer ceramic board, a chip-type electronic component accommodated within a space defined by a recessed portion or a through hole within the multilayer ceramic board, and a conductor wiring the chip-type electronic component provided between the layers or within the space of the multilayer ceramic board. Thus, the chip-type electronic component is accommodated within the space within the multilayer ceramic board, whereby a multilayer ceramic board having a desired shape is obtained without deteriorating planarity.

In the case of the multilayer ceramic board manufacturing method disclosed in Patent Document 2, functional devices, such as capacitor elements, inductor elements, resistance elements and other suitable devices, are produced using a plate-shaped sintered plate obtained by baking a ceramic functional device beforehand, and these functional devices are built in an unsintered compound layered article. The unsintered compound layered article includes a green layer as a base, a restraint layer including a hard-to-sinter material, and a wiring conductor, and when this is baked, the green layer defining a base is prevented from contracting in the main surface direction by the restraint layer. Therefore, the unsintered compound layered article can be baked in a state in which the functional devices are built in without any problems, and also the mutual diffusion of components are not caused between the functional device and the green layer defining a base, whereby the properties of the functional devices are maintained even after baking.

However, in the cases of the multilayer ceramic boards disclosed in Patent Document 1 and Patent Document 2, with an electrical connection configuration between a built-in electronic component and a wiring conductor of the multilayer board, each of the built-in electronic components and a wiring conductor provided on the multilayer board beforehand are connected at one side of either the upper portion or lower portion of the electronic component at the manufacturing stage, which causes a problem in which initial failure and deterioration in connection reliability is caused by a disconnection between the electronic component and the wiring conductor by layering offset at the time of layering or the difference between contraction behaviors at the time of baking.

In addition, as described in Patent Document 2, storing a sintered plate causes a problem in which the entire board is formed with a non-contraction process, but the conduction between the sintered plate and the wiring conductor is not sufficient.

SUMMARY OF THE INVENTION

To overcome the problems described above, preferred embodiments of the present invention provide a multilayer board including a built-in chip-type electronic component and a manufacturing method thereof, whereby disconnection between an internal wiring pattern and a built-in chip-type electronic component due to positional offset at the time of layering and contraction at the time of baking is effectively prevented, and the reliability of the connection configuration between a chip-type electronic component and a wiring conductor of the multilayer board is improved.

The multilayer board with built-in chip-type electronic component according to a preferred embodiment of the present invention is a multilayer board including a built-in chip-type electronic component including a multilayer board on which two or more dielectric layers including an inner conductor pattern are layered, and a chip-type electronic component which is provided at the interface of the upper and lower dielectric layers and also includes a terminal electrode, wherein the terminal electrode of the chip-type electronic component is connected to the inner conductor pattern provided at the interface via a first connection conductor extending along the chip-type electronic component in one direction from the interface and a second connection conductor extending along the chip-type electronic component in the direction opposite to the first connection conductor from the interface.

Preferably, a plated layer is not formed at the terminal electrode of the chip-type electronic component.

The multilayer board according to another preferred embodiment of the present invention is a multilayer board including a built-in chip-type electronic component including a multilayer board on which two or more dielectric layers including an inner conductor pattern are layered, and a chip-type electronic component which is provided at the interface of the upper and lower dielectric layers and includes an inner electrode with a portion exposed to the end surface as a terminal electrode, wherein the terminal electrode of the chip-type electronic component is connected to the inner conductor pattern provided at the interface via a first connection conductor extending along the chip-type electronic component in one direction from the interface and a second connection conductor extending along the chip-type electronic component in the direction opposite to the first connection conductor from the interface.

Preferably, the first connection conductor and the second connection conductor define connection conductors arranged to consecutively cover the upper surface end, the side, and the undersurface end of the chip-type electronic component.

Preferably, the two or more chip-type electronic components are disposed at the interface of the dielectric layer.

Preferably, the two or more chip-type electronic components are disposed in the layering direction of the dielectric layer.

Preferably, the dielectric layer is a low-temperature sintering ceramic layer, and the element body of the chip-type electronic component is a ceramic sintered article.

A method for manufacturing a multilayer board including built-in chip-type electronic component according to another preferred embodiment of the present invention includes a step of providing a first connection conductor material layer on a first dielectric material layer, a step of mounting a chip-type electronic component including a terminal electrode on the first dielectric material layer such that the terminal electrode thereof is in contact with the first connection conductor material layer, and a step of overlaying a second dielectric material layer including a second connection conductor material layer on the first dielectric material layer such that a portion of the second connection conductor material layer is in contact with a portion of the first connection conductor material layer.

Preferably, a plated layer is not formed at the terminal electrode of the chip-type electronic component.

Preferably, a chip-type electronic component including an inner electrode with a portion exposed to the end surface as the terminal electrode is provided as the chip-type electronic component.

Preferably, a low-temperature sintering ceramic green sheet is provided as the first and second dielectric material layers, and a ceramic sintered article is provided as the element body of the chip-type electronic component.

The invention according to preferred embodiments of the present invention provides a multilayer board including a built-in chip-type electronic component and a manufacturing method thereof, whereby disconnection between an internal wiring pattern and a built-in chip-type electronic component due to positional offset at the time of layering and contraction at the time of baking is effectively prevented, and the reliability of the connection configuration between a chip-type electronic component and a wiring conductor of the multilayer board is improved.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 1A-1C are diagrams illustrating a preferred embodiment of a multilayer board including a built-in chip-type electronic component according to the present invention, wherein FIG. 1A is a cross-sectional view illustrating the entirety thereof, FIG. 1B is a cross-sectional view enlarging and illustrating a portion of FIG. 1A, and FIG. 1C is a cross-sectional view enlarging and illustrating a portion of the chip-type electronic component shown in FIG. 1B.

FIGS. 4A and 4B are diagrams illustrating another preferred embodiment of the multilayer board including a built-in chip-type electronic component according to the present invention, wherein FIG. 4A is a cross-sectional view illustrating the principal portions thereof, and FIG. 4B is a cross-sectional view illustrating the principal portions of the manufacturing process thereof.

FIG. 7A is a cross-sectional view illustrating a multilayer board in which a ceramic sintered article is built in, and FIG. 7B is a cross-sectional view illustrating the ceramic sintered article shown in FIG. 7A.

FIGS. 8A and 8B are equivalent diagrams to FIGS. 2A and 2B illustrating the principal portions of the manufacturing process of a multilayer board with built-in chip-type electronic component according to yet another preferred embodiment of the present invention.

DETAILED DESCRIPTION OF PREFERRED EMBODIMENTS

The present invention will be described below with reference to preferred embodiments shown in FIG. 1A through FIG. 14E.

First Preferred Embodiment

Figure 1A:
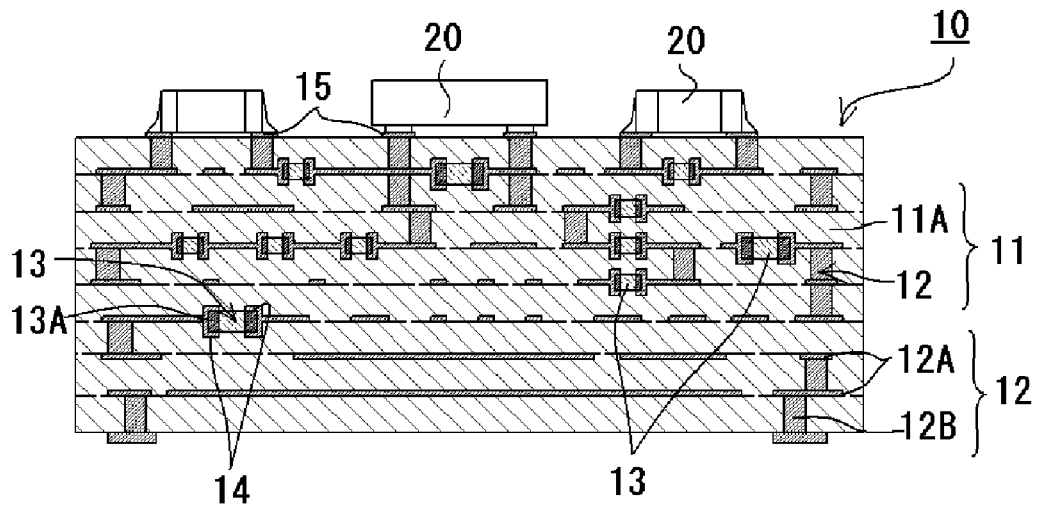

A chip-type electronic component including a built-in multilayer board 10 of the present preferred embodiment is, as shown in FIG. 1A, for example, configured so as to include a multilayer board 11 on which two or more dielectric layers 11A including inner conductor patterns 12 are layered, a chip-type electronic component 13, which is provided at the interface of the upper and lower dielectric layers 11A, including an external terminal electrode 13A at both end portions. The external terminal electrodes 13A of the chip-type electronic component 13 are connected to the inner conductor patterns 12 provided at the interface of the upper and lower dielectric layers 11A via first and second connection conductors 14A and 14B as described below.

Also, two or more surface mounted components 20 are mounted on the surface of the multilayer board 11. For the two or more surface mounted components 20, active elements, such as a semiconductor device, a GaAs semiconductor device, and other suitable active elements, and passive elements, such as a capacitor, an inductor, a resistance, and other suitable passive elements, are electrically connected to a surface electrode 15 on the multilayer board 11 via solder or an electroconductive resin, or via a bonding wire such as Au, Al, or Cu. The chip-type electronic component 13 and the surface mounted component 20 are mutually electrically connected via the surface electrode 15 and inner conductor pattern 12.

The material of the dielectric layers 11A defining the multilayer board 11 is not restricted to any particular material, but for example, may be configured of a ceramic material, or a hardening resin material, such as a thermosetting resin, a photo-setting resin, or other suitable hardening resin material. In order to make the inner conductor patterns 12 high in density, a ceramic material can be preferably used as a material of the multilayer board 11.

As a ceramic material, for example, a low-temperature sintered ceramic (LTCC: Low Temperature Co-fired Ceramic) material can be preferably employed. The low-temperature sintered ceramic material is a ceramic material capable of sintering at a temperature of about 1050° C. or less, and is a ceramic capable of baking simultaneously with silver, copper, or other metal which has small resistivity. Specifically, examples of the low-temperature sintered ceramic include a glass compound LTCC material made of a mixture of ceramic powder such as alumina, forsterite, or other suitable ceramic powder, and borosilicate glass, a crystallization glass LTCC material including $ZnO—MgO—Al_2O_3—SiO_2$ crystallization glass, and a non-glass LTCC material employing $BaO—Al_2O_3—SiO_2$ ceramic powder, $Al_2O_3—CaO—SiO_2—MgO—B_2O_3$ ceramic powder, or other suitable material. Using a low-temperature sintered ceramic material as the material of the multilayer board 11 enables metal having a low melting point at low resistance such as Ag, Cu, or other metal to be used as the inner conductor pattern 12 and surface electrode, and the multilayer board 11 and the inner conductor patterns 12 can be baked simultaneously at the low temperature of about 1050° C. or less.

Also, for a ceramic material, a high-temperature sintered ceramic (HTCC: High Temperature Co-fired Ceramic) material can be used. For a high-temperature sintered ceramic material, for example, sintering aids, such as glass, are added to a material, such as alumina, nitriding aluminum, mullite, or other suitable material, and are sintered at about 1100° C. or more. At this time, for the inner conductor pattern 12 and surface electrode, a metal chosen from molybdenum, platinum, palladium, tungsten, nickel, and an alloy thereof is used.

The multilayer board 11, as shown in FIG. 1A, includes the inner conductor pattern 12 provided therein, and the surface electrode 15 provided on the upper and lower both sides thereof. The inner conductor pattern 12 is an in-plane conductor 12A arranged with a predetermined pattern along the interface of the upper and lower dielectric layers 11A, and a via conductor 12B provided with a predetermined pattern so as to connect with the upper and lower in-plane conductors 12A.

Figure 1B:
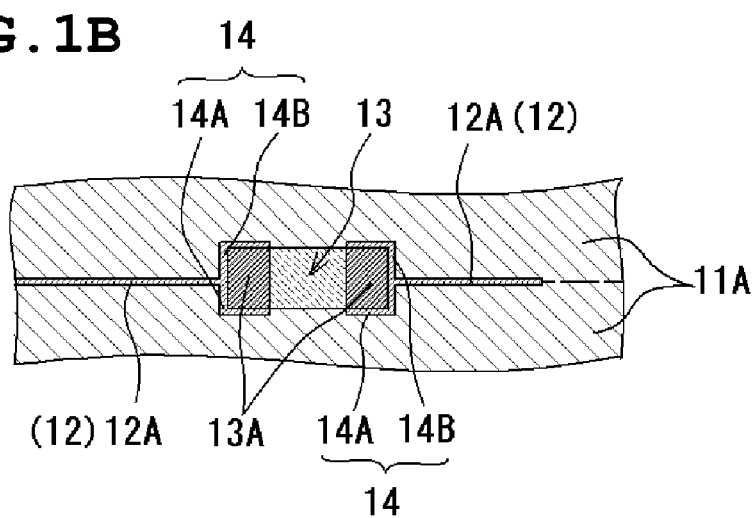

The chip-type electronic component 13, as shown in FIGS. 1A and 1B, is disposed at the interface of the upper and lower dielectric layers 11A and 11A, and the external terminal electrodes 13A thereof are connected to the inner conductor pattern 12 provided at the interface of the upper and lower dielectric layers 11A via the connection conductor 14. For the chip-type electronic component 13, though not particularly limited, for example, a component whose element body is a ceramic sintered article, such as barium titanate, ferrite, or other suitable material, which was baked at about 1200° C. or more, e.g., a chip-type electronic component, such as a capacitor, inductor, filter, balun, coupler, resonator, or other suitable component can be used, and one of or two or more of these chip-type electronic components can be selectively used depending on the purpose.

Figure 1C:
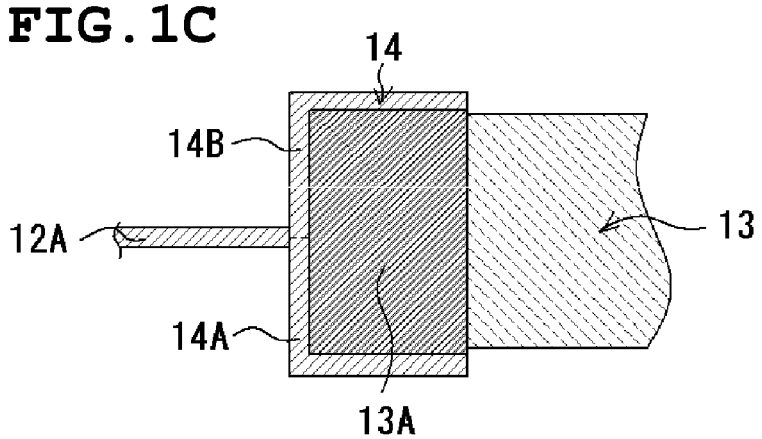

The connection conductor 14, as shown in FIGS. 1B and 1C, includes first and second connection conductors 14A and 14B. The first connection conductor 14A, as shown in the drawing, extends downward along the interface between the dielectric layer 11A at the lower side and the end surface of the external terminal electrode 13A from the in-plane conductor 12A provided at the interface between the upper and lower dielectric layers 11A and 11A where the chip-type electronic component 13 is disposed, and reaches the lower surface of the external terminal electrode 13A, whereby the cross-sectional shape of the side surface is substantially an L-shape. The second connection conductor 14B, as shown in the drawing, extends upward along the interface between the dielectric layer 11A at the upper side and the end surface of the external terminal electrode 13A from the in-plane conductor 12A provided at the interface between the upper and lower dielectric layers 11A and 11A where the chip-type electronic component 13 is disposed, and reaches the upper surface of the external terminal electrode 13A, whereby the cross-sectional shape of the side surface is substantially an upside-down L-shape. The widths of the first and second connection conductors 14A and 14B are preferably at least substantially the same as the width of the chip-type electronic component 13.

Accordingly, the first and second connection conductors 14A and 14B cover the upper surface end portion, end surface, and lower surface of the chip-type electronic component 13, which define the connection conductor 14 substantially having a C-shape whose cross section is substantially square (hereafter, simply referred to as C-shape) so as to grasp the external terminal electrode 13A from the upper and lower both surfaces, and are electrically connected to the three surfaces of the external terminal electrode 13A, and preferably to the five surfaces thereof including both side surfaces. The first and second connection conductors 14A and 14B are wider than the line width of the in-plane conductor 12A, such that even if there is positional offset in the width direction of the in-plane conductor 12A with respect to the in-plane conductor 12A, the first and second connection conductors 14A and 14B are securely connected to the in-plane conductor 12A, thereby connecting the in-plane conductor 12A and the external terminal electrode 13A.

Also, the external terminal electrode 13A and the first and second connection conductors 14, each of which include metal particles that exhibit grain growth at a stage of baking the multilayer board 11, and are integrally connected. Therefore, the external terminal electrode 13A of the chip-type electronic component 13 according to the present preferred embodiment differs from the case of surface mounting, in that a plating film, such as Ni, Sn, or other suitable metal, in not required to improve connection reliability to solder. Alternatively, if such a plating film is provided, the metal components of the plating film are scattered within the dielectric layer 11A during baking, and there is a tendency to reduce reliability.

The chip-type electronic component 13, as shown in FIG. 1A, can be disposed at any position of the interface of the upper and lower dielectric layers 11A and 11A as necessary with the above-described connection configuration. In other words, the one or two or more chip-type electronic components 13 may be disposed at the same interface of the upper and lower dielectric layers 11A and 11A as shown in the drawing, or the two or more chip-type electronic components 13 may be layered and disposed at different upper and lower interfaces. The two or more chip-type electronic components 13 are each mutually connected in series or in parallel via the in-plane conductor 12A and the connection conductor 14 whose cross section is substantially a C-shape depending on the purpose, whereby the advanced functions and advanced performance of the chip built-in multilayer board 10 is achieved with the reliable connection configuration.

Also, the surface mounted component 20 is used as appropriate in combination with the chip-type electronic component 13, as shown in FIG. 1A. The chip-type electronic component 13 and the surface mounted component 20 are mutually connected via the surface electrode 15, the inner conductor pattern 12, and the connection conductor 14. In the event that the surface mounted component 20 is a component which is readily influenced by power supply noise, such as an integrated circuit, a capacitor is connected approximately immediately under the power supply terminal of the surface mounted component 20 and the ground terminal as the chip-type electronic component 13, whereby noise is removed with high efficiency, to supply stable power supply voltage and prevent output oscillation, without restricting the terminal placement of the surface mounted component 20, such as an integrated circuit or other suitable component, and without separately mounting a chip-type electronic component (capacitor) on a motherboard.

Figure 2A:
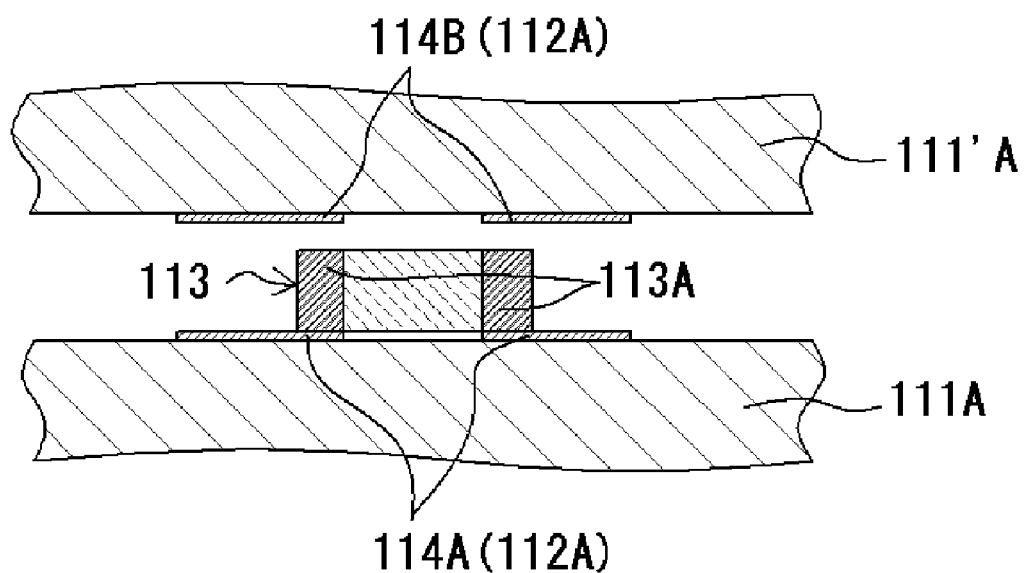
FIGS. 2A and 2B are process charts illustrating the principal portions of the manufacturing process of the multilayer board with built-in chip-type electronic component shown in FIGS. 1A-1C.
Figure 2B:
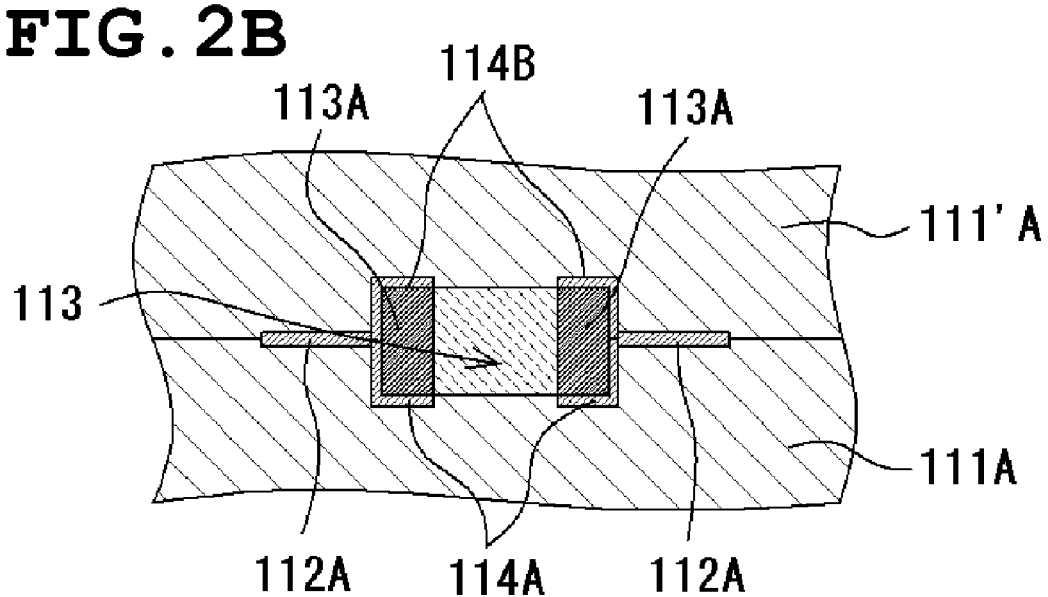
Figure 3:
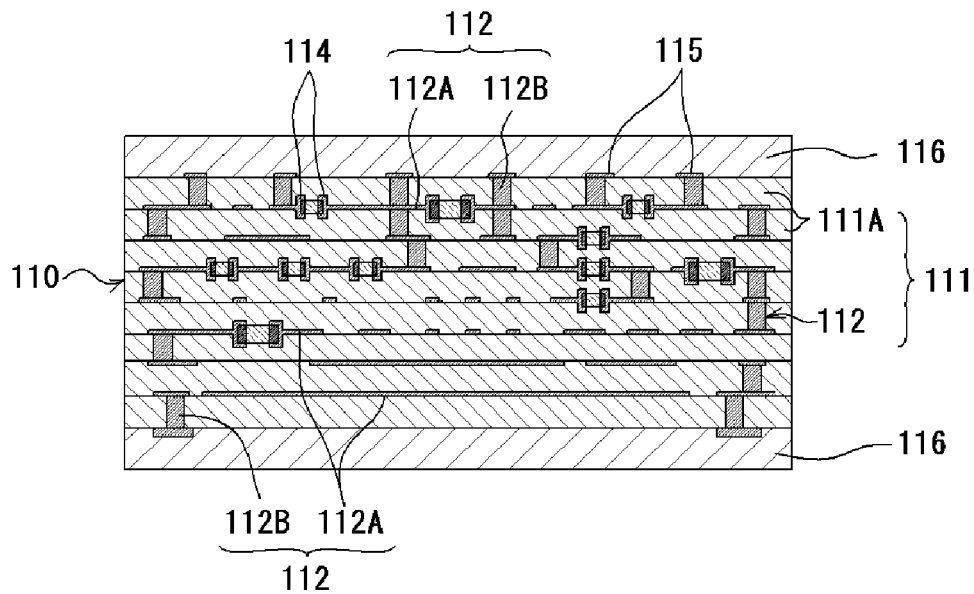
FIG. 3 is a process chart illustrating the principal portions of the manufacturing process of the multilayer board with built-in chip-type electronic component shown in FIGS. 1A-1C.

Next, description of a method for manufacturing the chip-type electronic component built-in multilayer board 10 will be provided with reference to FIGS. 2A and 2B and FIG. 3.

With the present preferred embodiment, description of the manufacturing the chip-type electronic component built-in multilayer board 10 using a non-contraction construction method will be provided. The non-contraction construction method means a construction method in which when using a ceramic material as the multilayer board 11, there is substantially no change in the size in the plane direction of the multilayer board before and after baking of the multilayer board.

With the present preferred embodiment, first, a predetermined number of sheets of the ceramic green sheet 111A shown in FIGS. 2A and 2B, and FIG. 3 are produced using slurry containing a low-temperature sintered ceramic material, for example. Also, via holes are formed with a predetermined pattern in the ceramic green sheet 111A defining the uppermost dielectric layer. Conductive paste which includes, for example, Ag, Cu, or Au as a principal component is filled in these via holes to form a via conductor portion 112B. Further, the same type of conductive paste is applied on the ceramic green sheet 111A with a predetermined pattern using the screen printing method to form a surface electrode portion 115, and the surface electrode portion 115 and the via conductor portion 112B are appropriately connected.

Also, with respect to the ceramic green sheet 111A in which the chip-type electronic component 13 is built in, an in-plane conductor portion 112A and the via conductor portion 112B are formed with each of patterns using the same method as the above-described method (see FIG. 3). With the ceramic green sheet 111A on which the chip-type electronic component 13 is disposed, as shown in FIG. 2A, when forming the in-plane conductor portion 112A, the first connection conductor portion 114A is also formed simultaneously integrally therewith using the screen printing method, and a second connection conductor portion 114B which corresponds to the first connection conductor portion 114A is formed on the lower surface of a ceramic green sheet 111'A to be layered thereupon using the screen printing method. The in-plane conductor portion 112A may be included in the second connection conductor portion 114B. Also, the in-plane conductor portion 112A and the via conductor portion 112B are formed in the ceramic green sheet 111A in which the chip-type electronic component 13 is not built in.

Following an organic adhesive layer (not shown) being formed on the upper surface of the ceramic green sheet 111A at which the chip-type electronic component 13 is disposed by applying or spraying an organic adhesive agent on the in-plane conductor portion 112A and first connection conductor portion 114A side using a spray or other suitable organic adhesive agent, as shown in FIG. 2A, the external terminal electrode portions 113A and 113A of a ceramic sintered article 113 defining the chip-type electronic component 13 manufactured beforehand are aligned with the first connection conductor portion 114A of the ceramic green sheet 111A, a chip-type electronic component whose element body is the ceramic sintered article 113 is mounted on the ceramic green sheet 111A, and the first connection conductor portion 114A and the external terminal electrode 113A of the ceramic sintered article 113 are joined and fixed via the organic adhesive layer. Subsequently, the ceramic green sheet 111'A on which the in-plane conductor 112A and the second connection conductor portion 114B are integrally formed, as shown in FIG. 2A, is aligned with the ceramic green sheet 111A, these sheets are subjected to temporary pressure-bonding with a predetermined pressure, and the ceramic sintered article 113 is built in the interface between the upper and lower ceramic green sheets 111A and 111'A, as shown in 2B. Note that for an organic adhesive agent, a mixture in which synthetic rubber, synthetic resin, and plasticizer are mixed may be used. Also, the thickness of the organic adhesive layer is preferably about 3 μm or less when applied, and about 1 μm or less when sprayed.

According to this temporary pressure-bonding, upper and lower halves of the ceramic sintered article 113 are embedded in the upper and lower ceramic green sheets 111A and 111'A, and the first connection conductor portion 114A of the lower-side ceramic green sheet 111A, and the second connection conductor portion 114B of the upper-side ceramic green sheet 111'A are each drawn in the upper and lower ceramic green sheets 111A and 111'A along with the external terminal electrode 113A to form a substantially C-shaped connection conductor portion 114. Note that in FIGS. 2A and 2B, for the sake of description, the lower-side ceramic green sheet is denoted by 111A, and the upper-side ceramic green sheet is denoted by 111'A. However, when consecutively providing the ceramic sintered article 113 in the upper and lower ceramic green sheets 111A, the lower-side ceramic green sheet also serves as the upper-side ceramic green sheet, such that when the ceramic sintered article 113 is provided over two or more steps, 111'A is denoted by 111A.

Subsequently, as shown in FIG. 3, the ceramic green sheet 111A including the in-plane conductor portion 112A and the via conductor portion 112B, and the two-ply ceramic green sheets 111A and 111A including the ceramic sintered article 113 are layered in a predetermined sequence, and the ceramic green sheet 111A including the surface electrode portion 115 of the uppermost layer is layered to obtain a raw layered article 111. Subsequently, a restraint layer 116 is disposed on the upper and lower surfaces of the raw layered article 111, the raw layered article 111 is subjected to heat pressure-bonding via the upper and lower restraint layers 116 with a predetermined temperature and pressure to obtain the pressure-bonded article 110 shown in FIG. 3. For the restraint layer 116, hard-to-sinter powder (e.g., ceramic powder having a high sintering temperature such as $Al_2O_3$) which is not sintered at the sintering temperature of the raw layered article 111, and specifically, a layer which is formed from a slurry including $Al_2O_3$ as a principle component, and including an organic binder as an accessory component, in a sheet shape, as shown in FIG. 3, is used.

Subsequently, the above-described pressure-bonded article 110 is baked at about 870° C. in an air atmosphere, for example, to obtain the chip-type electronic component built-in multilayer board 10, as shown in FIG. 1A. According to this baking, the raw layered article 111 is sintered to obtain the multilayer board 11, in which the chip-type electronic component 13 is built in, between the upper and lower restraint layers 116. Subsequently, the in-plane conductor 12A, first and second connection conductors 14A and 14B, the external terminal electrode 13A of the chip-type electronic component 13 within the multilayer board 11 whose metal particles of each exhibit grain growth to be integrated are connected in a secure manner. As for baking temperature, a temperature at which a low-temperature sintered ceramic material is sintered, e.g., a range of about 800° C. to about 1050° C. is preferable. There is the possibility that the ceramic components of the raw layered article 111 may not be fully sintered at a baking temperature of less than about 800° C., and there is also the possibility that the metal particles of the inner conductor pattern 12 and the connection conductor 14 will be melted and scattered in the ceramic layer at a baking temperature exceeding about 1050° C.

The restraint layers 116 are removed by blast processing and ultrasonic cleaning treatment after baking to obtain the chip-type electronic component built-in multilayer board 10. Subsequently, as shown in FIG. 1A, a predetermined surface mounted component 20 is mounted on the surface electrode 15 of the chip-type electronic component built-in multilayer board 10 using a method, such as solder, to obtain a final product. Note that with the present preferred embodiment, the external terminal electrode 113A of the ceramic sintered article 113 defining the chip-type electronic component 13 may be an electrode to which conductive paste was applied and printed, or may be an electrode before conductive paste is applied, dried, and printed thereto.

With the present preferred embodiment, the first and second connection conductors 14A and 14B for connecting the in-plane conductor 12A and the external terminal electrode 13A, as shown in FIG. 1A to FIG. 3, define a cross-sectional substantially C-shape by both of the first and second connection conductors 14A and 14B which are symmetrical upper and lower sides thereof. However, the first and second connection conductors 14A and 14B may form a shape which is not symmetrical at the upper and lower sides such as shown in FIGS. 4A and 4B and FIGS. 5A and 5B.

Figure 4A:
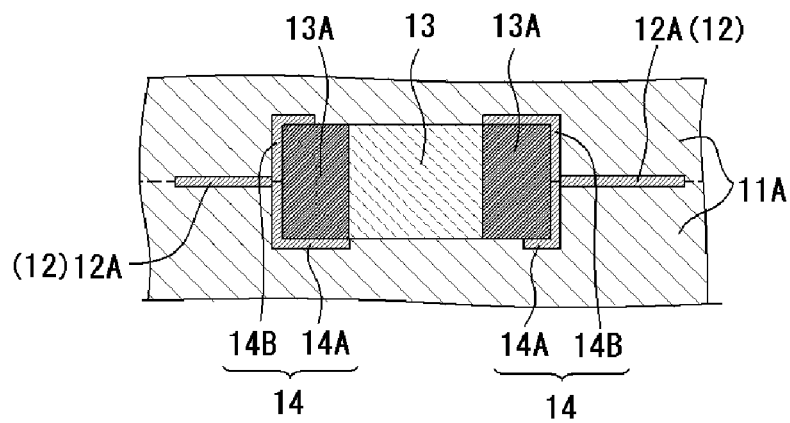
Figure 4B:
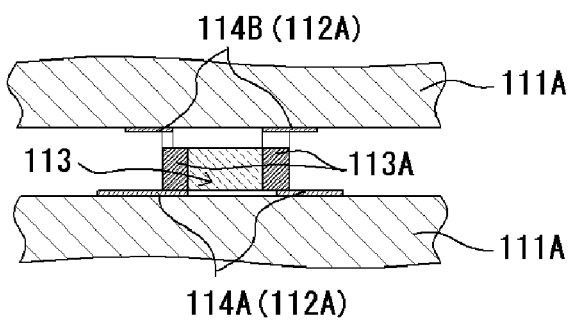

As shown in FIG. 4A, the left-side first connection conductor 14A and the right-side second connection conductor 14B are configured in the same manner as the first and second connection conductors of the above-described preferred embodiment shown in FIG. 1A to FIG. 3. However, the left-side second connection conductor 14B and the right-side first connection conductor 14A are shorter than in the above-described preferred embodiment. The first and second connection conductors 14A and 14B on either side are mutually point symmetrical, if the longitudinal direction of the chip-type electronic component 13 is used in the cross section. When obtaining such a connection configuration, as shown in FIG. 4B, the left and right first connection conductor portions 114A and 114A are formed on the lower-side ceramic green sheet 111A such that the right end of the left-side first connection end portion 114A is positioned at the inner end of the external terminal electrode 113A of the corresponding ceramic sintered article 113, and the left end of the right-side first connection end portion 114A is positioned in the middle of the inner end of the corresponding external terminal electrode 113A. The left and right second connection conductor portions 114B and 114B are arranged on the upper-side ceramic green sheet 111A so as to have the relation opposite to the case of the left and right first connection conductor portions 114A and 114A. Subsequently, as with the above-described preferred embodiment, the ceramic sintered article 113 intervenes between the upper and lower ceramic green sheets 111A and 111A, and these sheets are subjected to pressure-bonding and baking, thereby obtaining the connection configuration shown in FIG. 4A.

Figure 5A:
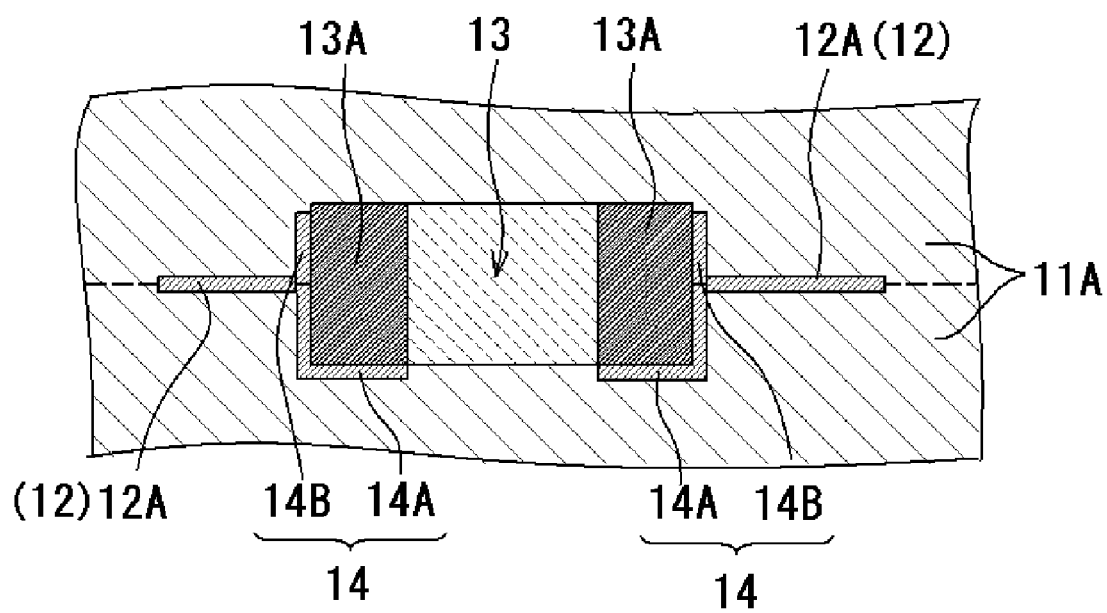
FIGS. 5A and 5B are diagrams illustrating yet another preferred embodiment of the multilayer board with built-in chip-type electronic component according to the present invention, and are equivalent diagrams to FIGS. 4A and 4B.
Figure 5B:
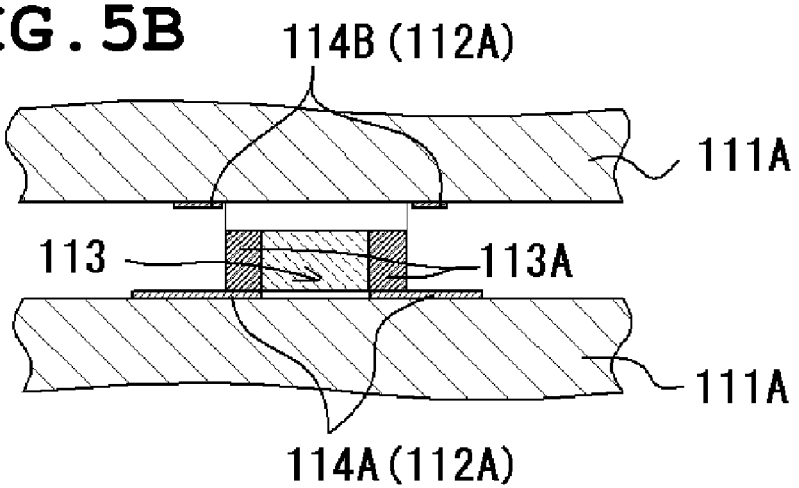

As shown in FIG. 5A, the first and second connection conductors 14A and 14B are vertically asymmetrical, but are bilaterally-symmetrical. As shown in FIG. 5A, the first connection conductor 14A is configured in the same manner as that in the above-described preferred embodiment shown in FIG. 1A to FIG. 3. However, the second connection conductor 14B covers only the end surface of the external terminal electrode 13A, and does not reach the upper surface thereof. In order to obtain such a connection configuration, as shown in FIG. 5B, the first connection end portion 114A is formed on the lower-side ceramic green sheet 111A in the same manner as the above-described preferred embodiment shown in FIG. 1A to FIG. 3. The left and right second connection conductor portions 114B and 114B, as shown in FIG. 5B, are formed such that each of the inner ends are positioned outside the corresponding external terminal electrode 113A. Subsequently, as with the above-described preferred embodiments, the ceramic sintered article 113 intervenes between the upper and lower ceramic green sheets 111A and 111A, and these sheets are subjected to pressure-bonding and baking, thereby obtaining the connection configuration shown in FIG. 5A.

Figure 6A:
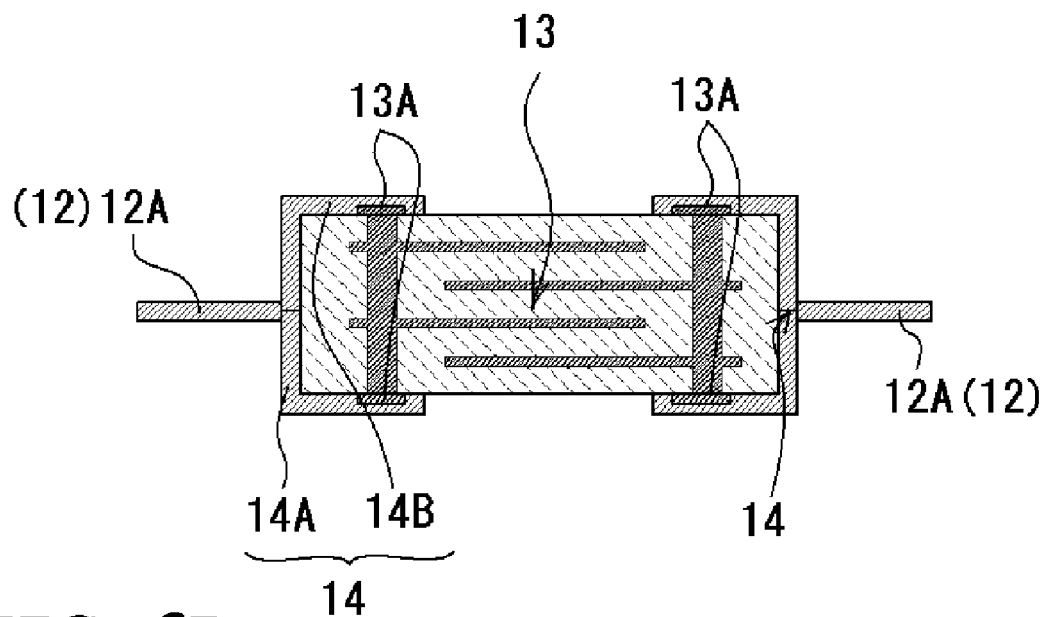
FIGS. 6A and 6B are cross-sectional views illustrating the principal portions of yet another preferred embodiment of the multilayer board including a built-in chip-type electronic component according to the present invention.
Figure 6B:
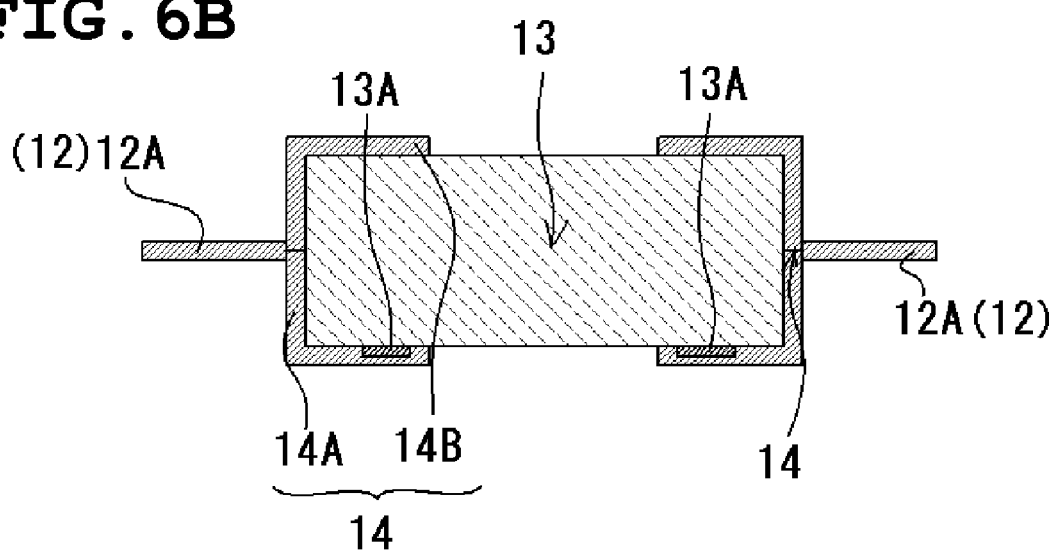

Also, the external terminal electrode 13A of the chip-type electronic component 13 does not cover the entire region of both end portions as in the above-described preferred embodiments, and may be partially exposed to the upper and lower both surfaces of both end portions as shown in FIG. 6A, or may be partially exposed to one of the upper and lower surfaces of both end portions as shown in FIG. 6B.

As described above, the multilayer board with built-in chip-type electronic component according to the present preferred embodiment includes the multilayer board 11 on which the two or more dielectric layers 11A are layered including the inner conductor pattern 12, and the chip-type electronic component 13 which is provided at the interface of the upper and lower dielectric layers 11A and 11A and also includes the external terminal electrodes 13A and 13A at both end portions, wherein the external terminal electrodes 13A and 13A of the chip-type electronic component 13 are connected to the inner conductor pattern 12 provided at the interface, specifically connected to the in-plane conductor 12A via the first connection conductor 14A extending downward along the chip-type electronic component 13 from the interface of the upper and lower dielectric layers 11A and 11A, and the second connection conductor 14B extending in the direction opposite to the first connection conductor 14A upward along the chip-type electronic component 13 from the interface, whereby disconnection between the in-plane conductor 12A and the external terminal electrode 13A due to positional offset at the time of layering the ceramic green sheet 111A and contraction at the time of baking is effectively prevented, and the reliability of the connection configuration between the chip-type electronic component 13 and the inner conductor pattern 12 of the multilayer board 11 is improved.

Also, according to the present preferred embodiment, the two or more chip-type electronic components 13 are disposed at the interface of the upper and lower dielectric layers 11A and 11A, or the two or more chip-type electronic components 13 are disposed over the upper and lower interfaces in the layering direction, whereby the chip-type electronic components 13 can be built in with high density in accordance with the desired functions and performance, and advanced functions and advanced performance are promoted.

Also, according to the present preferred embodiment, the dielectric layer 11A is a low-temperature sintered ceramic layer, and the element body of the chip-type electronic component 13 is the ceramic sintered article 113, whereby the chip-type electronic component 13 can be built in by preventing the mutual scattering of the ceramic material between the dielectric layer 11A and the ceramic sintered article 113 at the time of baking without impairing the performance of the ceramic sintered article 113.

Also, the method for manufacturing a multilayer board with built-in chip-type electronic component according to the present preferred embodiment includes a step of providing the first connection conductor portion 114A on the ceramic green sheet 111A, a step of mounting the ceramic sintered article 113 including the external terminal electrode 113A on the ceramic green sheet 111A as an element body such that the external terminal electrode 113A is in contact with the first connection conductor portion 114A, and a step for overlaying the ceramic green sheet 111A including the second connection conductor portion 114B with the ceramic green sheet 111A such that a portion of the second connection conductor portion 114B is in contact with a portion of the first connection conductor portion 114A, whereby the chip-type electronic component built-in multilayer board 10 having a connection configuration can be manufactured in which the in-plane conductor 12A of the multilayer board 11 and the external terminal electrode 13A of the chip-type electronic component 13 according to the present preferred embodiment are securely connected via the connection conductor 14.

Second Preferred Embodiment

A feature of a multilayer board with built-in chip-type electronic component according to the present preferred embodiment is that a chip-type electronic component having no external terminal electrode is built in a multilayer board, and the others are configured in substantially the same manner as those in the first preferred embodiment. Therefore, with the present preferred embodiment, description will be made by denoting the same and equivalent components as those in the first preferred embodiment with the same reference numerals.

Figure 7A:
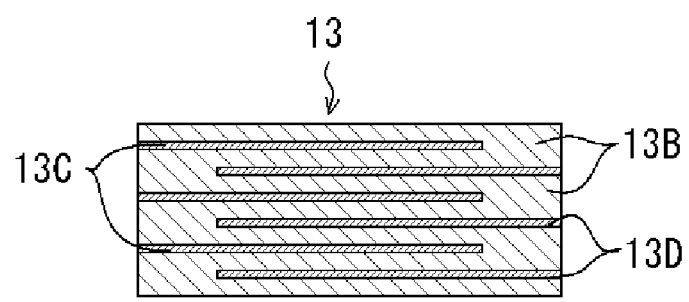
FIGS. 7A and 7B are diagrams illustrating yet another preferred embodiment of the multilayer board including a built-in chip-type electronic component according to the present invention.

For the chip-type electronic component 13 provided in the present preferred embodiment, as shown, for example, in FIG. 7A, a ceramic sintered article having no external terminal electrode is provided. With the present preferred embodiment, a ceramic sintered article is provided as the chip-type electronic component 13, such that the ceramic sintered article will be described as the chip-type electronic component 13. This chip-type electronic component 13 is, as shown in FIG. 7A, configured as a multilayer capacitor including a layered article including two or more layered ceramic layers 13B, two or more first and second internal electrodes 13C and 13D interposed between the upper and lower ceramic layers 13B. With the first internal electrode 13C, one end is exposed at the left-side end surface of the layered article, and the other end is extended to near the right-side end surface, and the end surface exposed at the left-side end surface is provided as a terminal electrode. With the second internal electrode 13D, one end is exposed at the right-side end surface of the layered article, and the other end is extended to near the left-side end surface, and the end surface exposed at the right-side end surface is provided as a terminal electrode. Note that the chip-type electronic component 13 may be an inductor, filter, balun, coupler, resonator, or other suitable component, similar to the above-described preferred embodiment, instead of a capacitor.

Figure 7B:
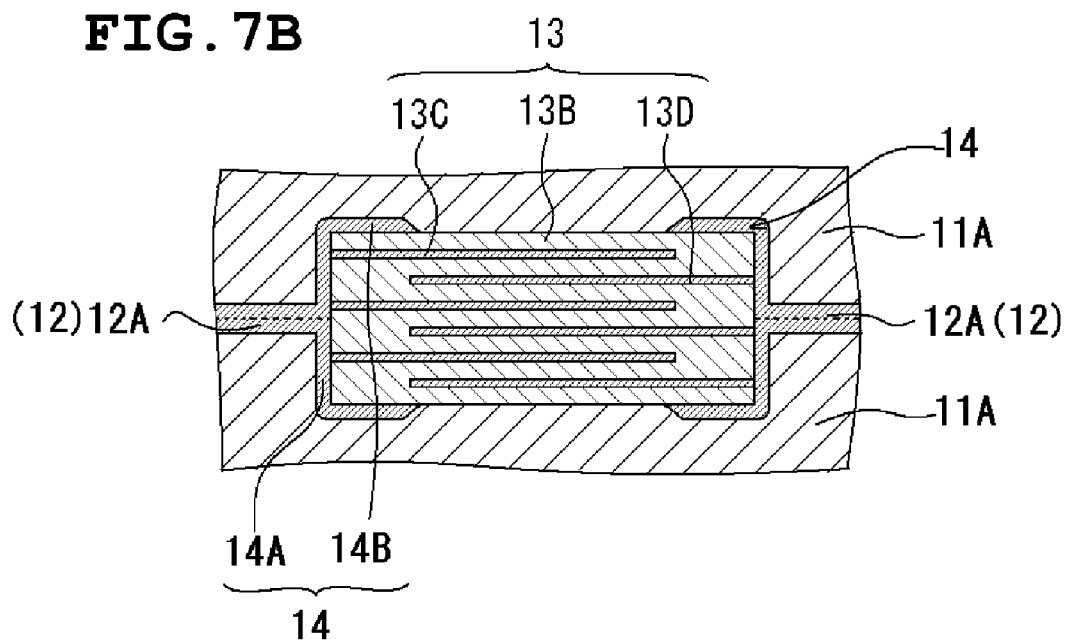

The above chip-type electronic component 13 is, within the chip-type electronic component built-in multilayer board 10, as shown in FIG. 7B, disposed at the interface of the upper and lower dielectric layers 11A and 11A, and the end surfaces of the first and second internal electrodes 13C and 13D define terminal electrodes, and are connected to the first and second connection conductors 14A and 14B of the connection conductor 14, and consequently, are connected to the inner conductor pattern 12 provided at the interface of the upper and lower dielectric layers 11A.

Therefore, according to the present preferred embodiment, the exposed portions from the end surfaces of the first and second internal electrodes 13C and 13D define terminal electrodes, and are connected to the connection conductor 14. Consequently, with the first and second internal electrodes 13C and 13D of the chip-type electronic component 13, the exposed portions (terminal electrodes) are securely connected to the inner conductor pattern 12 provided within the multilayer board 11 via the connection conductor 14. Accordingly, the external terminal electrode of the thick film of the ceramic sintered article 113 may be omitted, and the same operational effect as the above-mentioned preferred embodiment is achieved.

Third Preferred Embodiment

With the above-described preferred embodiments, an arrangement is provided in which the restraint layers are disposed on the upper and lower both surfaces of the raw layered article 111 to manufacture the chip-type electronic component built-in multilayer board 10. However, in a portion of the raw layered article 111 being enlarged and shown in FIG. 8A, for example, even if an arrangement is provided in which restraint layers 116A are disposed between the upper and lower ceramic green sheets 111A and 111A, and the ceramic green sheets 111A and the thin restraint layers 116A are alternately disposed to define the raw layered article 111, the multilayer board including the built-in chip-type electronic component can be manufactured in a similar manner to the above-described preferred embodiments. With the present preferred embodiment, the thickness of the ceramic green sheet 111A is preferably greater than the thickness of the restraint layer 116A, and specifically, is preferably set in a range of thicknesses of about five times to about 20 times the thickness of the restraint layer 116A, for example. In this case, as shown in FIG. 8B, hard-to-sinter powder forming the restraint layer 16A remains over two or more stages between the respective dielectric layers 11A of the multilayer board 11, but at the baking stage of the raw layered article 111 glass components included in the ceramic green sheet 111A are melted to be scattered within the hard-to-sinter powder, the restraint layer 16A solidifies, and is integrated with the dielectric layer 11. Note that the restraint layer 116A may be provided on the upper-side ceramic green sheet 111A.

With the present preferred embodiment, the restraint layers 116A intervene between the upper and lower ceramic green sheets 111A of the raw layered article 111, such that lateral contraction and irregularities in size due to baking are suppressed for each ceramic green sheet 111A, whereby the chip-type electronic component built-in multilayer board 10 has outstanding dimensional accuracy and substantially no warping. Accordingly, as the size of the chip-type electronic component built-in multilayer board 10 increases, the dimensional accuracy and suppressed warp of the chip mounted board is further improved.

EXAMPLES

Next, description will be provided below regarding specific examples. With the present example, the chip-type electronic components embedded in various types of array patterns within the chip-type electronic component built-in multilayer board 10 shown in FIG. 1A were manufactured using the non-contraction method for each pattern as a chip-type electronic component built-in board, and verification was made regarding a connection state between the external terminal electrode of each chip-type electronic component and an in-plane conductor via a connection conductor.

Example 1

Figure 9:
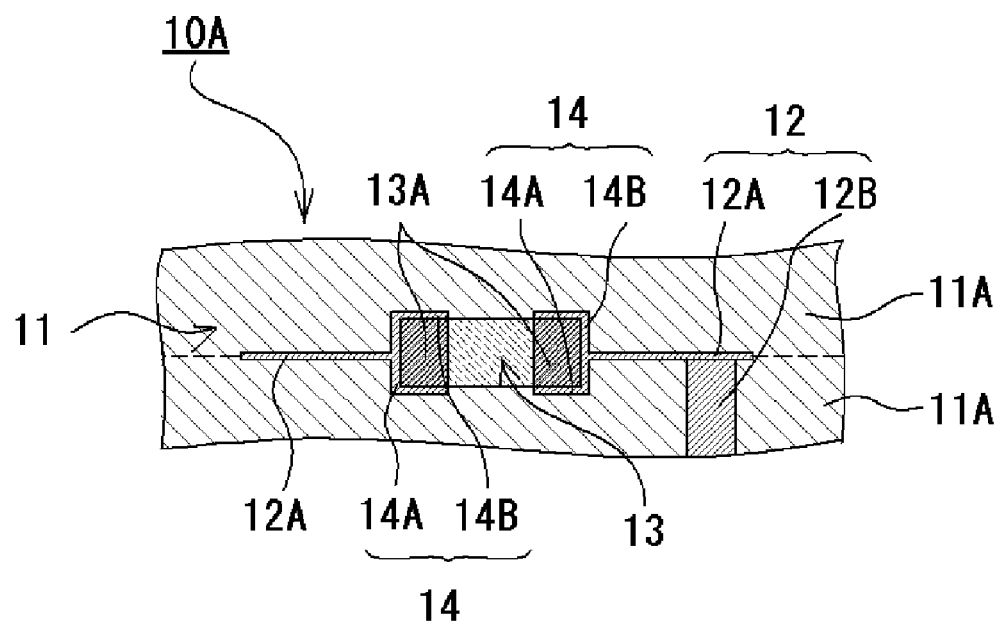
FIG. 9 is a cross-sectional view illustrating the chip-type electronic component built-in board obtained with one example of preferred embodiments of the present invention.

With the present example, as shown in FIG. 9, a chip-type electronic component built-in board 10A in which one chip-type electronic component 13 is built in at the interface between the upper and lower dielectric layers 11A and 11A was manufactured, and confirmation was made regarding the connection configuration between the in-plane 12A within the chip-type electronic built-in board 10A and the external terminal electrode 13A of the chip-type electronic component 13 via the connection conductor 14.

To manufacture the chip-type electronic component built-in board 10A, first the slurry including a low-temperature sintered ceramic material (with $Al_2O_3$ as filler, and borosilicate glass as sintering aids) was applied on a carrier film, and two or more ceramic green sheets were produced. The one ceramic green sheet was subjected to laser processing to form a via hole, and with this ceramic green sheet disposed on a smooth table in close contact, conductive paste whose principal component is Ag powder was forced into the via hole of the ceramic green sheet using a squeegee from the carrier film side, and simultaneously, excessive conductive paste was scraped off to form a via conductor portion. The same conductive paste was screen-printed on this ceramic green sheet to simultaneously form an in-plane conductor portion and a first connection conductor portion in a predetermined pattern, following which a predetermined pressure was applied to this ceramic green sheet, and was layered on a restraint layer whose principal component is $Al_2O_3$ to produce a first layered article. The pressure at this time is preferably about 1 MPa to about 150 MPa. The ceramic green sheet defining the first layered article is referred to as a first ceramic green sheet below.

Next, an organic adhesive agent was applied on the first ceramic green sheet using a spray to form an organic adhesive layer having a thickness of about 1 μm, following which a multilayer capacitor was mounted so as to be aligned with the first connection conductor portion using a mounter, and was joined and fixed to the first connection conductor portion. The multilayer capacitor is defined by a ceramic sintered article (size: 1.0 mm×0.5 mm×0.2 mm, capacitance of internal electrode: 80 pF) baked at about 1300° C., and conductive paste whose principal component is Ag is applied to both ends thereof to form an external terminal electrode. The external terminal electrode is not subjected to plating processing. Note that with the multilayer capacitor, a dielectric ceramic material obtained by adding $BaTiO_3$ as a principal component, and Sr, W, Ca, and K as accessory components is used as a ceramic material, and a mixture of Ag and Pd is used as an internal electrode material.

Also, another ceramic green sheet was subjected to screen printing of the in-plane conductor portion and the second connection conductor portion with a predetermined pattern to produce a second ceramic green sheet, the in-plane conductor portion and the second connection conductor portion were turned face up, and the ceramic green sheet was layered on a restraint layer whose principal component is $Al_2O_3$ to produce the second layered article.

Subsequently, the ceramic green sheet of the second layered article was disposed facing the ceramic green sheet of the first layered article, alignment was performed between the chip-type electronic component on the first layered article and the second connection conductor portion of the second layered article, the first and second layered articles were subjected to temporary pressure-bonding via the corresponding first and second ceramic green sheets to obtain a raw layered article in which a chip-type electrode component is built in. The pressure at the time of temporary pressure-bonding is preferably not less than about 20 MPa. There is a possibility that if this pressure is less than about 20 MPa, pressure-bonding between the upper and lower ceramic green sheets is not sufficient, and accordingly, exfoliation between layers may occur.

Further, a predetermined pressure was applied to the raw layered article to perform this pressure-bonding to produce a pressure-bonded article. The pressure at the time of the pressure-bonding is preferably between about 98 MPa and about 196 MPa. There is the possibility that if the pressure at the time of this pressure-bonding is less than about 98 MPa, pressure-bonding becomes insufficient, and accordingly, exfoliation between layers may occur at the time of baking, and if the pressure exceeds about 196 MPa, there is the possibility that breakage of built-in chip-type electronic components and disconnection of conductors may occur. Subsequently, following baking of the pressure-bonded article being performed under air atmosphere of about 870° C., the restraint layer was removed to obtain the chip-type electronic component built-in board 10A shown in FIG. 9. The thickness of this chip-type electronic component built-in board 10A was about 0.4 mm.

When the chip-type electronic component built-in board 10A according to the present example was cut, and observation using an SEM photo was performed, it was determined that the in-plane conductor 12A, the first and second connection conductors 14A and 14B, and the external terminal electrode 13A of the chip-type electronic component 13, in each of which metal particles exhibit grain growth, are integrated by combination of the metal, and moreover, are integrally connected by the external terminal electrode 13A of the chip-type electronic component 13 being grasped by the connection conductor 14 having a substantially C-shaped cross section defined by the first and second connection conductors 14A and 14B. Also, as a result of measuring the capacity value of the built-in chip-type electronic component 13, a capacity value substantially equal to the ceramic sintered article before baking was obtained. Consequently, it was determined that the chip-type electronic component 13 can be built into the multilayer board 11.

Also, the aspect ratio between the thickness of the chip-type electronic component 13 and the thickness of the upper and lower dielectric layers 11A and 11A after baking is preferably not less than about 4 (not less than 1:4). If this aspect ratio is not more than about 4, there is the possibility that the thickness of the chip-type electronic component 13 is reflected upon the surfaces of the dielectric layers 11A and 11A, and planarity is deteriorated.

Also, when the thickness of the ceramic sintered article to be built in as the chip-type electronic component 13 was changed from about 0.2 mm to about 0.1 mm, it was confirmed that there is no gap caused between the in-plane conductor 12A, first and second connection conductors 14A and 14B, external terminal electrode 13A, and dielectric layer 11A. Thus, it was determined that reducing the thickness of the chip-type electronic component 13 enables a flatter board surface to be obtained, and the advantage of the non-contraction process to be sufficiently obtained, whereby a chip built-in board having no gap around a chip-type electronic component and a conductor is obtained, and a chip built-in board having a higher reliability is obtained.

Example 2

Figure 10:
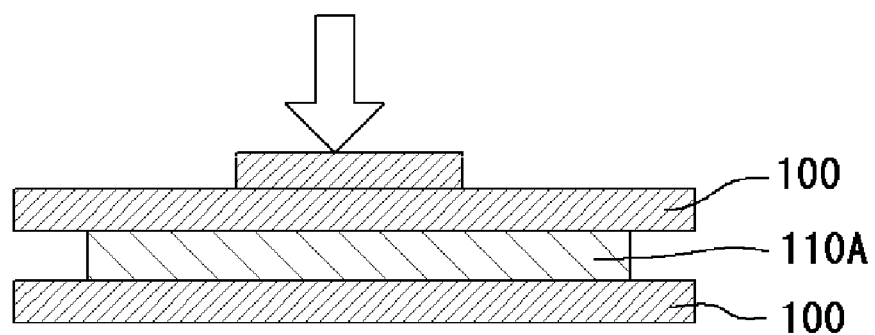
FIG. 10 is a cross-sectional view illustrating a pressurized baking process in another example of preferred embodiments of the present invention.

With the present example, the first and second layered articles were produced in the same manner as in example 1, and the first and second layered articles were layered to produce a raw layered article. Subsequently, when baking the raw layered article, as shown in FIG. 10, ceramic setters 100 having porous properties were disposed at the upper and lower sides of the raw layered article 110A, these three articles were piled, pressure of about 1 MPa was applied from above the ceramic setter, the pressurization baking of the raw layered article was performed at about 870° C. in the same manner as in example 1 to obtain a chip-type electronic component built-in board. The pressure used to perform pressurization baking is preferably not less than about 0.1 MPa. As for the ceramic setter 100, a setter having porous properties is provided, whereby degreasing at the time of baking can be performed.

With the present example, pressurization is performed at the time of baking, whereby the planarity of the chip-type electronic component built-in board is promoted, and even if the thickness ratio between the chip-type electronic component to be built in and the dielectric layer after baking is less or equal to 4, the planarity of the board surface is not deteriorated. Also, with the present example, description has been provided with respect to the case of baking only one step of the raw layered article. However, such a raw layered article may be layered over two or more steps.

Example 3

Figure 11:
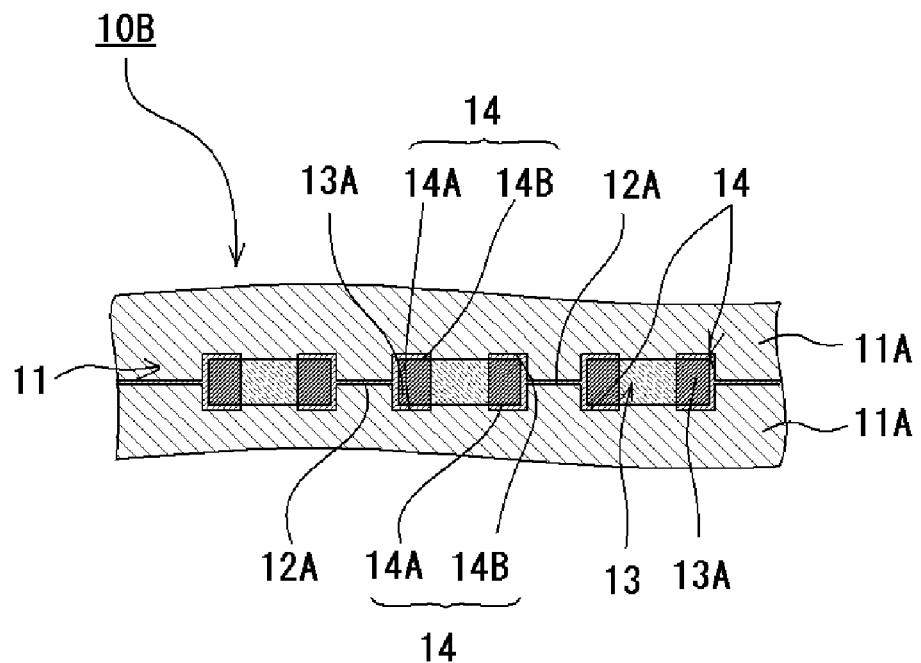
FIG. 11 is a cross-sectional view illustrating the chip-type electronic component built-in board obtained with yet another example of preferred embodiments of the present invention.

With the present example, as shown in FIG. 11, a chip-type electronic component built-in board 10B was manufactured in the same manner as in example 1 except that the three chip-type electronic components 13 were arrayed and built in at the interface between the upper and lower dielectric layers 11A and 11A, and it was confirmed the connection configuration between the in-plane conductor 12A and the external terminal electrodes 13A of the chip-type electronic components 13 via the connection conductor 14 in the same manner as in example 1. As for the three chip-type electronic components 13, as shown in FIG. 11, advanced functions are promoted by configuring these using circuits connected in series or in parallel.

Example 4

Figure 12:
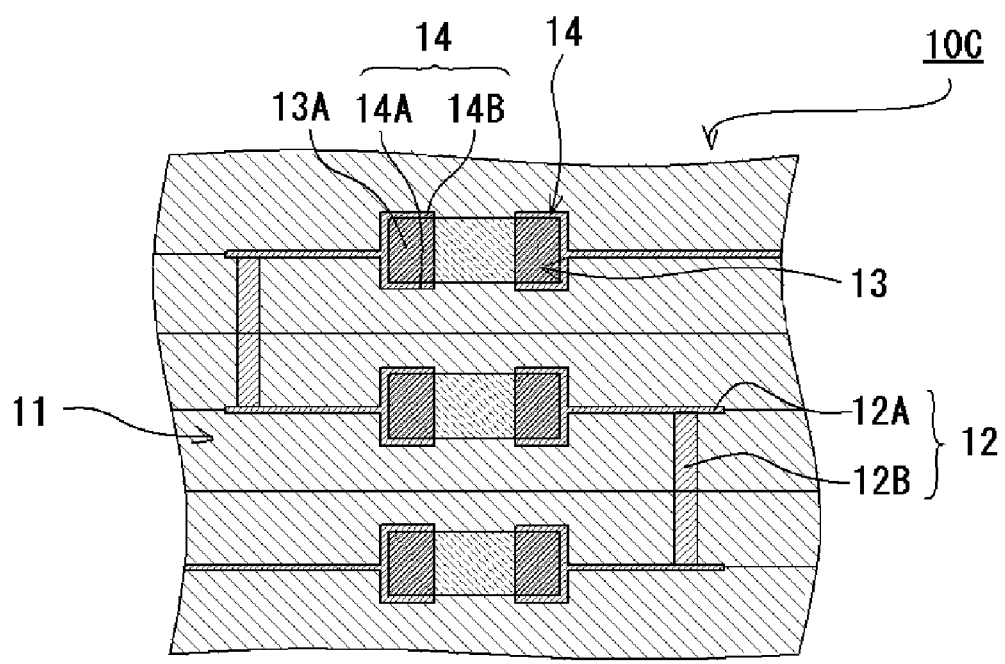
FIG. 12 is a cross-sectional view illustrating the chip-type electronic component built-in board obtained with yet another example of preferred embodiments of the present invention.

With the present example, as shown in FIG. 12, a chip-type electronic component built-in board 10C was manufactured in the same manner as in example 1 except that the chip-type electronic components 13 were built in over three steps, and it was confirmed the connection configuration between the in-plane conductor 12A and the external terminal electrodes 13A of the chip-type electronic components 13 via the connection conductor 14 in the same manner as in example 1. As for the three chip-type electronic components 13, as shown in FIG. 12, advanced functions are promoted by configuring these using circuits connected in series or in parallel.

Example 5

Figure 13:
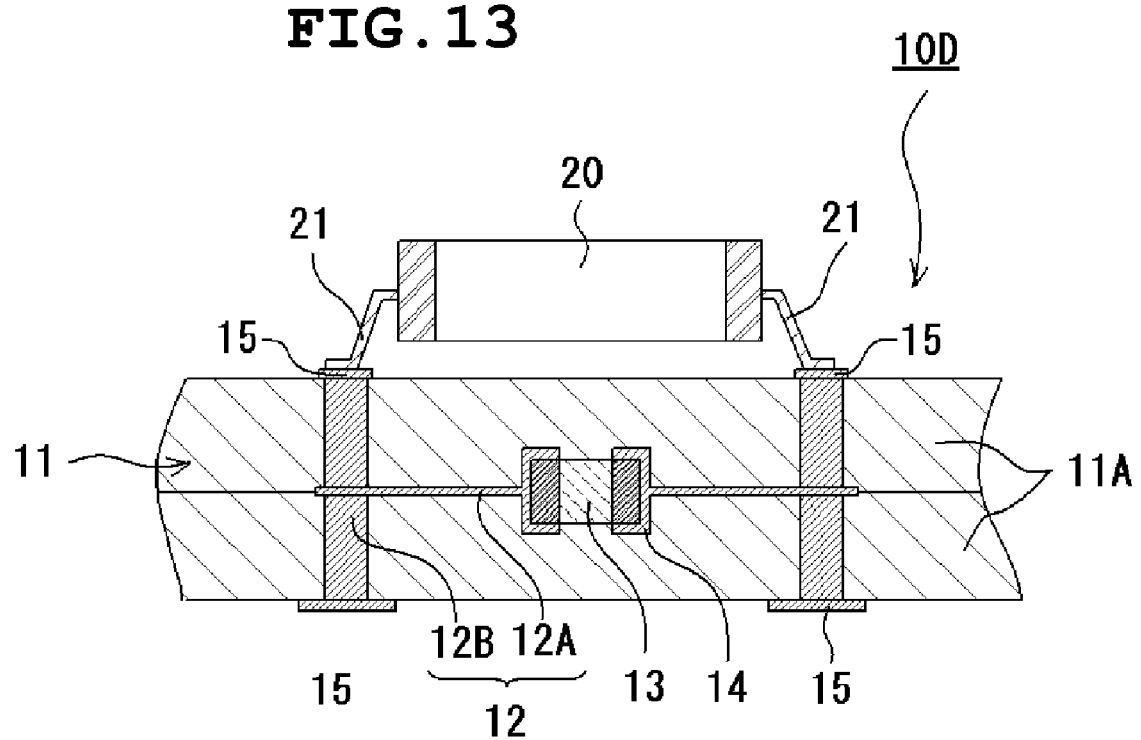
FIG. 13 is a cross-sectional view illustrating the chip-type electronic component built-in board obtained with yet another example of preferred embodiments of the present invention.

With the present example, as shown in FIG. 13, the chip-type electronic component 13 was built in at the interface between the upper and lower dielectric layers 11A and 11A to produce a chip-type electronic component built-in board 10D in the same manner as in example 1, and the surface electrodes 15 and 15 were formed on the upper and lower both surfaces of this chip-type electronic component built-in board 10D. Subsequently, the surface mounted component 20 was mounted on the surface electrode 15 on the chip-type electronic component built-in board 10D via a bonding wire 21. The surface mounted component 20 is electrically connected to the chip-type electronic component 13 via the surface electrode 15, inner conductor pattern 12, and connection conductor 14 on the upper surface of the board, and further connected to the surface electrode 15 on the upper surface of the board. The pair of the surface electrodes 15 and 15 on the upper surface of the board connected to the external electrode terminal of the surface mounted component 20 define the power supply terminal and ground terminal of the surface mounted component 20, and the surface electrodes 15 on the lower surface of the board define the power supply terminal and ground terminal at the product side, i.e., the power supply terminal electrode and ground terminal electrode of the surface mounted component 20.

When mounting a component which is readily affected by power noise, such as an integrated circuit device, as the surface mounted component 20, a capacitor is provided as the built-in chip-type electronic component 13, and the capacitor is disposed approximately immediately below the connection terminal of the integrated circuit device, whereby noise is removed with high efficiency, such that stable supply of power supply voltage, prevention of output oscillation, and other advantages are obtained, without restricting the placement of the external terminal electrode of the integrated circuit device, and without separately mounting the capacitor on a motherboard. At this time, the distance between the external terminal electrode 13A of the built-in chip-type electronic component 13 and the via conductor 12B is preferably set to about 500 μm or less, whereby the noise removal effects are sufficiently exhibited.

Example 6

With the present example, a chip-type electronic component built-in board having the same configuration as the example 1 was manufactured in the same way as the example 1 except that a recessed portion was provided on the ceramic green sheet, and a chip-type electronic component was built in within this recessed portion.

Figure 14A:
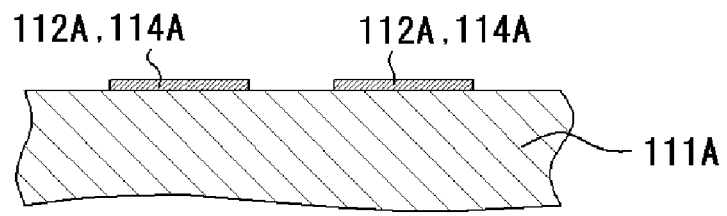
FIGS. 14A-14E are cross-sectional views illustrating the process of yet another example of preferred embodiments of the present invention.
Figure 14B:
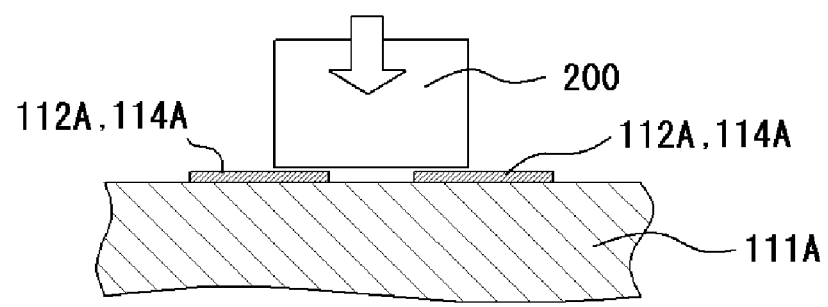
Figure 14C:
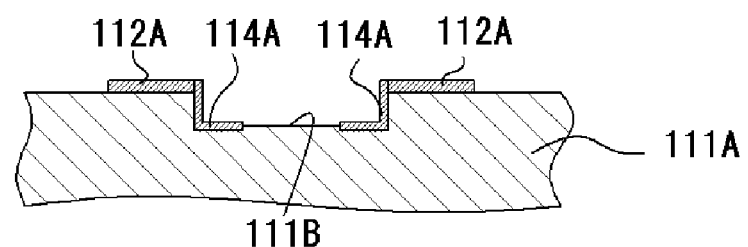
Figure 14D:
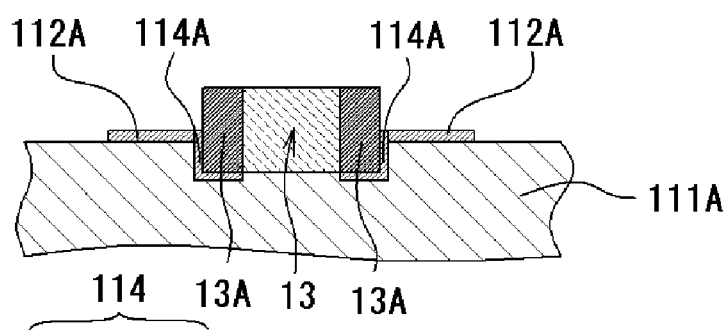
Figure 14E:
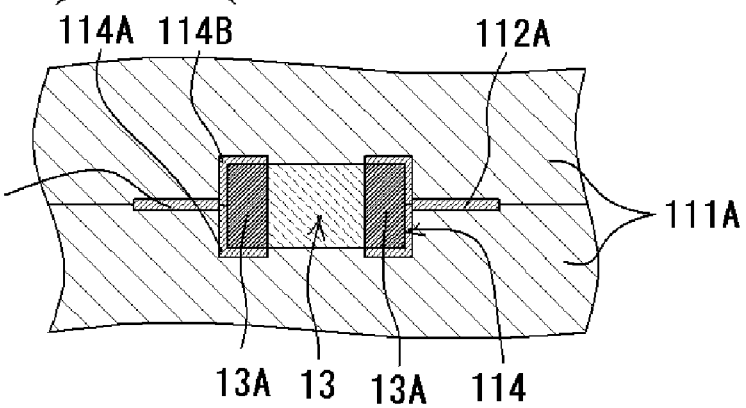

Specifically, with the present example, first as shown in FIG. 14A, as with the example 1, the in-plane conductor portion 112A and the first connection conductor portion 114A were simultaneously formed on the ceramic green sheet 111A using screen printing in the same manner as in example 1, following which as shown in FIG. 14B, a mold 200 was disposed in contact with a predetermined position, following which as shown in FIG. 14C, the mold 200 was pushed therein with a predetermined pressure to form a recessed portion 111B having a predetermined depth of the ceramic green sheet 111A. Subsequently, as shown in FIG. 14D, the ceramic sintered article 113 defining the chip-type electronic component 13 was disposed in the recessed portion 111B of the ceramic green sheet 111A, following which the ceramic green sheet 111A where the in-plane conductor portion 112A and the second connection conductor portion 114B were formed was aligned with the lower surface, and was subjected to pressure-bonding with a predetermined pressure, whereby the ceramic sintered article 113 was built in at the interface between the upper and lower ceramic green sheets 111A and 111A, as shown in FIG. 14E. Subsequently, this was subjected to baking in the same manner as in example 1 to obtain a chip-type electronic component built-in board. Note that with the present example, the recessed portion 111B was formed with the mold 200. However, the recessed portion 111B may be formed with another method, such as laser processing or other suitable method.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer board including built-in chip-type electronic component, comprising:
    a multilayer board including at least two layered dielectric layers and an inner conductor pattern; and
    a chip-type electronic component provided at an interface of upper and lower dielectric layers of the at least two dielectric layers and including a terminal electrode; wherein
    the inner conductor pattern is provided at the interface of the upper and lower dielectric layers;
    a first connection conductor extending along said chip-type electronic component in one direction from said interface, and a second connection conductor extending along said chip-type electronic component in a direction opposite to said first connection conductor are provided;
    the first connection conductor and the second connection conductor are connected with the inner conductor pattern at the interface; and
    at least one of the first connection conductor and the second connection conductor is connected with the terminal electrode of the chip-type electronic component.

2. The multilayer board with built-in chip-type electronic component according to claim 1, wherein a plated layer is not provided at the terminal electrode of said chip-type electronic component.

3. The multilayer board with built-in chip-type electronic component according to claim 1, wherein said first connection conductor and said second connection conductor define connection conductors arranged to consecutively cover an upper surface end, a side, and an undersurface end of said chip-type electronic component.

4. The multilayer board with built-in chip-type electronic component according to claim 1, wherein at least two of said chip-type electronic components are disposed at an interface of said at least two dielectric layers.

5. The multilayer board with built-in chip-type electronic component according to claim 1, wherein at least two of said chip-type electronic components are disposed in a layering direction of said at least two dielectric layers.

6. The multilayer board with built-in chip-type electronic component according to claim 1, wherein said at least two dielectric layers are low-temperature sintering ceramic layers, and an element body of said chip-type electronic component is a ceramic sintered article.

7. A multilayer board with built-in chip-type electronic component including:
    a multilayer board including at least two layered dielectric layers and an inner conductor pattern; and
    a chip-type electronic component which is provided at an interface of upper and lower dielectric layers of the at least two dielectric layers and includes an inner electrode having a portion exposed to an end surface as a terminal electrode; wherein
    the inner conductor pattern is provided at the interface of the upper and lower dielectric layers;
    a first connection conductor extending along said chip-type electronic component in one direction from said interface, and a second connection conductor extending along said chip-type electronic component in a direction opposite to said first connection conductor are provided;
    the first connection conductor and the second connection conductor are connected with the inner conductor pattern at the interface; and
    at least one of the first connection conductor and the second connection conductor is connected with the terminal electrode of the chip-type electronic component.

8. The multilayer board with built-in chip-type electronic component according to claim 7, wherein said first connection conductor and said second connection conductor define connection conductors arranged to consecutively cover an upper surface end, a side, and an undersurface end of said chip-type electronic component.

9. The multilayer board with built-in chip-type electronic component according to claim 8, wherein at least two of said chip-type electronic components are disposed in a layering direction of said at least two dielectric layers.

10. The multilayer board with built-in chip-type electronic component according to claim 8, wherein said at least two dielectric layers are low-temperature sintering ceramic layers, and an element body of said chip-type electronic component is a ceramic sintered article.

11. The multilayer board with built-in chip-type electronic component according to claim 7, wherein at least two of said chip-type electronic components are disposed at an interface of said at least two dielectric layers.

* * * * *